US007095257B2

(12) United States Patent
Whittaker

(10) Patent No.: US 7,095,257 B2
(45) Date of Patent: Aug. 22, 2006

(54) FAST LOW DROP OUT (LDO) PFET REGULATOR CIRCUIT

(75) Inventor: Edward J. W. Whittaker, Bishop's Stortford (GB)

(73) Assignee: SiGe Semiconductor (U.S.), Corp., Methuen, MA (US)

( * ) Notice: Subject to any disclaimer, the term of this patent is extended or adjusted under 35 U.S.C. 154(b) by 86 days.

(21) Appl. No.: 10/840,613

(22) Filed: May 7, 2004

(65) Prior Publication Data

US 2005/0248331 A1 Nov. 10, 2005

(51) Int. Cl.
*H03B 21/00* (2006.01)

(52) U.S. Cl. ...................................... 327/108; 323/314

(58) Field of Classification Search ................ 327/108, 327/434; 323/314; 330/252, 253

See application file for complete search history.

(56) References Cited

U.S. PATENT DOCUMENTS 6,066,979 A 5/2000 Adams et al.
6,285,246 B1 9/2001 Basu
6,501,305 B1 * 12/2002 Rincon-Mora et al. ..... 327/108
6,703,813 B1 3/2004 Vladislav et al.
6,703,815 B1 3/2004 Biagi

FOREIGN PATENT DOCUMENTS

EP 1 376 294 A1 1/2004

OTHER PUBLICATIONS

Trauth, Vanhuffel, Trichet, "An Advanced Controller for Multi-Band Open Loop Power Control Mode RF Power Amplifier", Microwave Engineering, Jul. 2002, pp. 39-40.

* cited by examiner

*Primary Examiner*—Shawn Riley
(74) *Attorney, Agent, or Firm*—Kenyon & Kenyon LLP

(57) ABSTRACT

A low dropout (LDO) PFET regulator circuit is disclosed for operating in two modes of operation. For higher supply voltage potentials the LDO PFET regulator circuit operates normally, as supply voltage potential drops, the LDO PFET regulator operates in a second mode of operation where a decision circuit determines whether to supply a first boost current thereto in order to compensate for the reduced transimpedance of the first PFET.

28 Claims, 3 Drawing Sheets

FAST LOW DROP OUT (LDO) PFET REGULATOR CIRCUIT

FIELD OF THE INVENTION

The invention relates to the field PFET regulator circuits and more specifically to the field of low dropout (LDO) PFET regulator circuits.

BACKGROUND OF THE INVENTION

In typical RF systems, ON and OFF switching of transmitted RF signal power is controlled in order to avoid spectral splatter of the transmitted RF signal into adjacent transmission channels. Typically, a process known as burst shaping is employed in order to control the switching transients. In traditional RF transmission systems, a detector circuit in conjunction with a feedback loop is used to control PA output power. However, this traditional system has transient response limitations, which affects an attack ramp and a decay ramp of the transmitted RF signal and also offers complications in calibration procedures.

A publication, entitled "An advanced controller for multi-band open loop power control mode RF power amplifier," Microwave Engineering, July 2002, issued to Trauth et al., describes a scheme for regulating the PA output power by controlling supply voltage provided to the PA on the supply voltage rails. Trauth et al. describe the difficulty of controlling a fast PFET regulator as it operates in the triode region. A solution in this publication is proposed that precludes operation of the PFET in the triode region. The problem with not allowing operation of the PFET in the triode region, as described by Trauth et al., is that the PFET size has to be significantly increased in order to obtain the same DC low drop out voltage condition. Otherwise the available supply voltage provided by the PFET regulator to the PA is restricted. This restriction results in decreased power consumption efficiency of the combined PFET and PA circuit and is thus unacceptable.

A need therefore exists for a compact LDO PFET regulator that offers an operating efficiency that overcomes the limitations of the prior art when used in conjunction with a PA. It is therefore an object of the invention to provide a LDO PFET regulator that operates in the triode region.

SUMMARY OF THE INVENTION

In accordance with the invention there is provided a low drop out (LDO) regulator circuit for providing a regulated output voltage from a supply voltage source comprising: a regulator circuit comprising an output port and a first regulating FET having gate, drain and source terminals, the output port coupled to the drain terminal for providing the regulated output voltage therefrom, the first regulating FET for operating in first mode of operation when a potential of the supply voltage source is above a predetermined potential; and, a decision circuit for deciding whether to increase a transconductance to the first regulating FET when a potential of the supply voltage is one of at the predetermined potential and below the predetermined potential such that the first regulating FET operates in a second mode of operation.

In accordance with the invention there is provided a method of providing a regulated output voltage from a supply voltage source comprising: providing a field effect transistor (FET) regulator circuit comprising a regulating FET; operating the regulating FET in a saturation mode of operation; and, upon operation of the regulating FET in a triode region, providing increased signal gain to the regulating FET.

In accordance with the invention there is provided a method of providing a regulated output voltage from a supply voltage source comprising: providing a field effect transistor (FET) regulator circuit comprising a regulating FET; providing a decision circuit coupled to the FET regulator circuit; providing a first boost circuit coupled with the FET regulator circuit; operating the regulating FET in a saturation mode of operation; upon operation of the regulating FET in the triode region, enabling operation of the first boost circuit for providing a first boost current; enabling operation of the decision circuit; and, deciding using the decision circuit whether to provide the first boost current to the FET regulator circuit for resulting in an increase in a signal that is provided to the gate terminal of the regulating FET.

In accordance with the invention there is provided a low drop out (LDO) regulator circuit for providing a regulated output voltage from a supply voltage source comprising: an output port; a regulator circuit comprising a first FET having gate, drain and source terminals, the output port coupled to the drain terminal for providing the regulated output voltage therefrom, the first FET for operating in first mode of operation when a potential of the supply voltage source is above a predetermined potential; a voltage reference for providing a reference potential; a first long tail pair of transistors comprising first and second transistors having emitter, collector and base terminals; a second current source coupled to the base terminal of the second transistor from the first long tail pair of transistors; a first resistor disposed between the base terminal of the second transistor of the first long tail pair and the second current source and the drain terminal of the first FET and the output port, the second current source for sinking a second current in order to increase the potential of the regulated output voltage; a first current source connected to the emitter terminals for emitting a first current that is proportional to absolute temperature thereto, where the voltage reference is for providing a reference voltage to the base terminal of the first transistor of the first long tail pair of transistors; and, a decision circuit comprising a second FET having a gate terminal coupled to the gate terminal of the first FET for reducing a transimpedance of the first FET by controlling a provision of a first boost current for provision to the long tail pair when the potential of the supply voltage source is below the predetermined potential such that the first FET operates in a second mode of operation thereof and is for other than providing the first boost current when the potential of the supply voltage source is above the predetermined potential.

BRIEF DESCRIPTION OF THE DRAWINGS

Exemplary embodiments of the invention will now be described in conjunction with the following drawings, in which.

DETAILED DESCRIPTION OF EMBODIMENTS OF THE INVENTION

Figure 1:
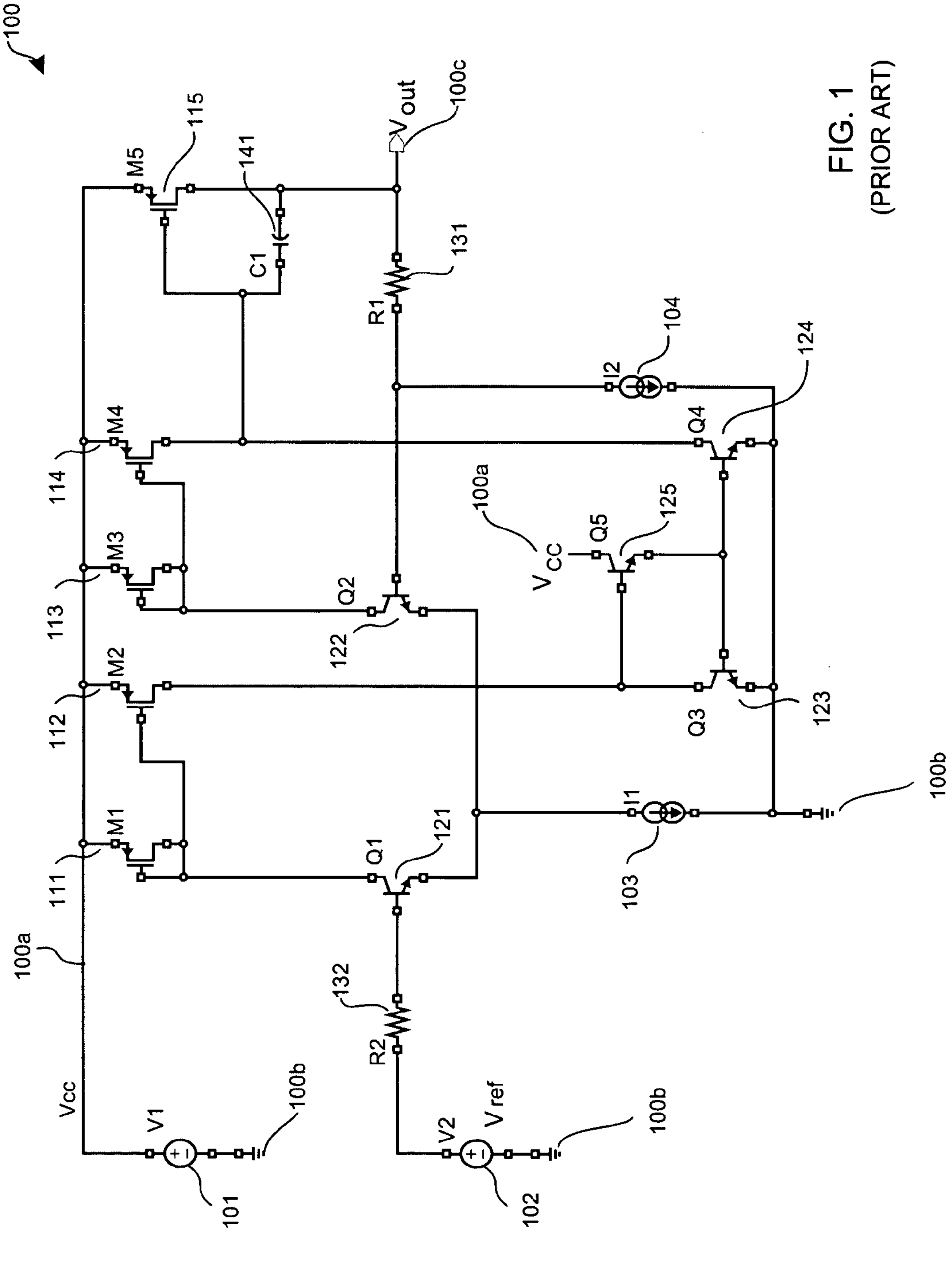
FIG. 1 (PRIOR ART)
FIG. 1 illustrates a prior art low dropout (LDO) regulator circuit.

FIG. 1 illustrates a prior art LDO regulator circuit 100. A positive channel Field effect transistor (PFET) M5 115 is a voltage regulating element. Transistors, Q1 121, Q2 122, Q3 123, Q4 124 and Q5 125 form an operational amplifier circuit. A supply voltage is provided by a voltage source 101 disposed between a first supply voltage input port 100*a* and a second supply voltage input port 100*b*. A voltage reference source (Vref) 102 is connected through resistor R2 132 to a base terminal of transistor Q1 121. Because transistor Q2 122 mirrors transistor Q1 121, the potential on the base terminal of transistor Q2 122 is approximately Vref. A first current source 103, for providing a first current (I1), is disposed between the emitter terminals of transistors Q1 121 and Q2 122 and the emitter terminals of transistors Q3 123 and Q4 124. The transconductance (gm) of the operational amplifier circuit is dependent upon the transistor pair Q1 121 and Q2 122 and is determined by the first current (I1). Output port 100*c* is connected to the drain terminal of PFET M5 115 and via resistor R1 131 to a second current source 104, for sinking of a second current (I2).

A regulated output voltage (Vout) of the prior art LDO circuit 100 is defined by equation (1):

$$Vout=Vref+I2*R1 \tag{1}$$

by sinking current using the second current source 104, the output signal (Vout) increases and is larger than Vref as described in equation (1). For the condition that PFET M5 115 is in its saturation mode of operation, otherwise known as a linear mode of operation, the frequency response of the PFET regulator 100 for changing of the reference voltage (Vref) is approximately represented by equation (2):

$$\omega=gm/(C_{dg}+C1) \tag{2}$$

where gm is the transconductance of the control amplifier formed by transistors Q1 121 and Q2 122 and $C_{dg}$ is the drain gate capacitance of PFET M5 115. Capacitor C1 141 is disposed between the drain and gate terminals of FET M1 115. In the saturation mode of operation, the gate terminal of PFET M5 115 acts like a virtual ground.

The first current (I1), emitted from the first current source 103, is ideally proportional to absolute temperature, and in conjunction with bipolar transistors Q1 111 and Q2 112, is used in order to maintain an approximately constant gain of the PFET M5 115 with temperature.

In operation, as the PFET M5 115 approaches a triode region of operation, an inverted p+ channel length of the PFET M5 115 increases and thus a percentage of depleted channel decreases. Finally when PFET M5 115 enters the triode region, which is the low drop out condition, the depleted channel no longer exists. The large inverting voltage gain from the gate terminal to the drain terminal falls dramatically and in some cases falls to below unity for an extreme low dropout condition. At this point, a dominant capacitance of the PFET M5 115 is the gate terminal to source terminal capacitance and as a result, the gate terminal of PFET M5 115 no longer sufficiently functions as a virtual ground. As a result, the transimpedance of PFET M5 115 is no longer $1/\omega C_{dg}$ but is substantially decreased therefrom. The frequency response of the PFET regulator circuit 100 is similarly reduced and as a result a time lag is observed between enabling and disabling of the prior art LDO regulator circuit 100, similar to that reported by Trauth et al. when describing turn off characteristic of the regulator circuit. Furthermore, a decreased slope of the rising edge of prior art LDO regulator circuit output signal is observed from output port 100*c* as the PFET M5 115 approaches the triode region of operation.

Figure 2:
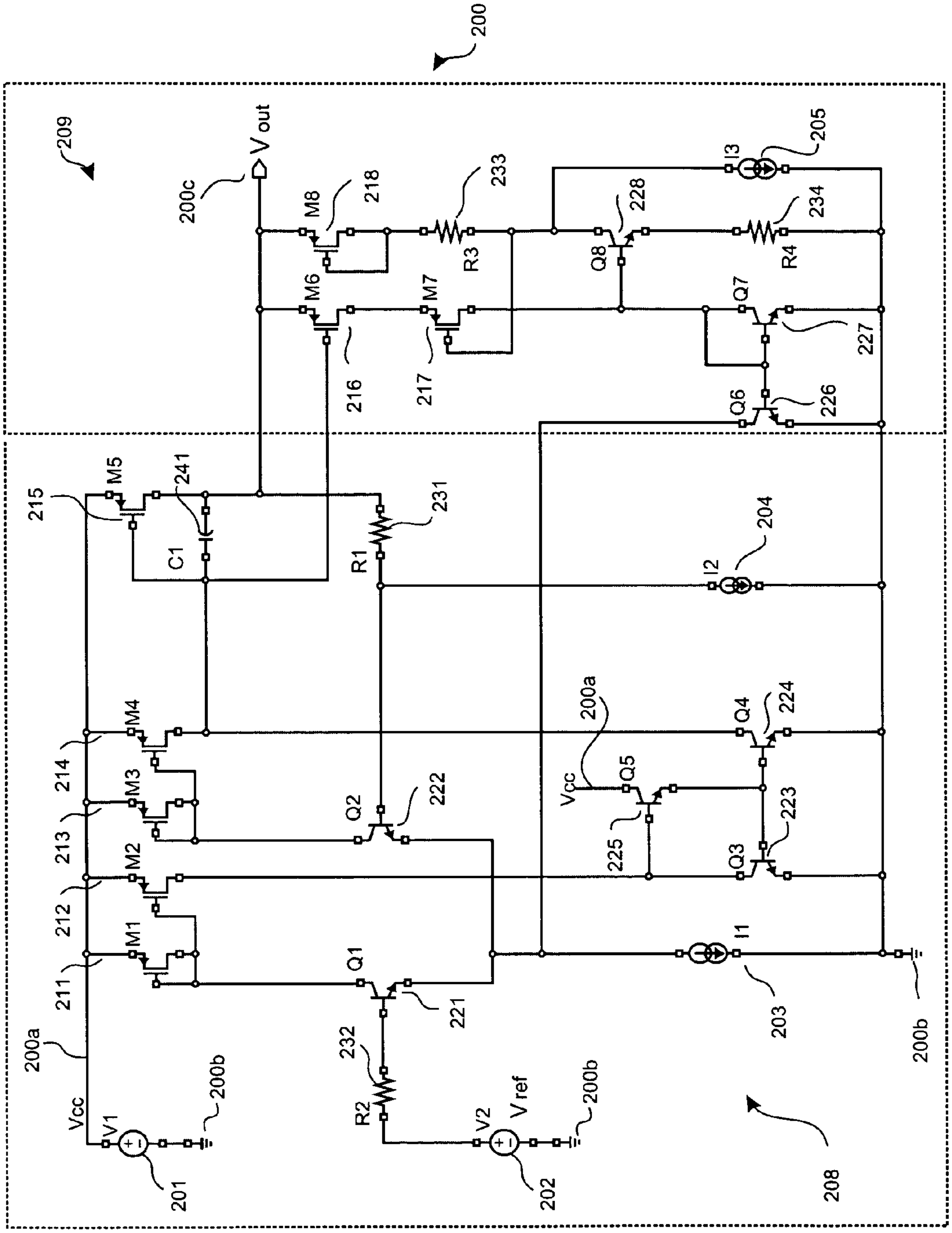
FIG. 2 illustrates a single amplifier LDO PFET regulator circuit that includes a decision circuit for providing a first boost current to the PFET for operating of the PFET in the triode region; and, FIG. 3 illustrates a dual boost circuit LDO PFET regulator circuit with PFET triode region compensation by using first and first boost circuits.

FIG. 2 illustrates a first embodiment of the invention, a current boost PFET regulator circuit 200 that maintains frequency response of a PFET M5 215 within its triode region of operation. The first embodiment of the invention is comprised of a PFET regulator circuit 208 and a decision circuit 209. Transistors Q1 221 and Q2 222 form a first controlling amplifier that supplies a drive current to the gate terminal of PFET M5 215.

The PFET regulator circuit 208 is similar to that illustrated in FIG. 1, except that some of the active components are larger in area in order to propagate more current. Disposed within the PFET regulator circuit 208 are transistors, Q1 221, Q2 222, Q3 223, Q4 224 and Q5 225, which form an operational amplifier circuit. A supply voltage is provided by a voltage source 201 disposed between a first supply voltage input port 200*a* and a second supply voltage input port 200*b*. A voltage reference source (Vref) 202 is connected through resistor R2 232 to a base terminal of transistor Q1 221. A first current source 203 is disposed between the emitter terminals of transistors Q1 221 and Q2 222 and the second supply voltage terminal 200*b* for providing a first current thereto. Output port 200*c* is connected to the drain terminal of FET M5 215 and via resistor R1 231 is connected to a second current source 204 for receiving of a second current (I2) therefrom.

A regulated output voltage (Vout) emitted from the output port 200*c* of the PFET regulator circuit 208 is defined by equation (3):

$$Vout=Vref+I2*R1 \tag{3}$$

by sinking the second current using the second current source 204, in the form of a programmable current source, the regulated output voltage (Vout) is increased.

In the decision circuit 209, FET M6 216 is a similar short channel device to PFET M5 215 and it is used to detect an onset of triode region in the PFET M5 215. FET M7 217 is disposed in such a manner that FET M6 216 operates at a drain source potential similar to PFET M5 215 and FET M8 218, which provides the bias voltage for FET M7 217 via resistor R3 233. The decision circuit 209 functions in deciding an extent of the triode region for PFET M5 215 and for changing the transconductance of PFET M5 215 in dependence upon the extent of the triode region.

During initial operation of the current boost PFET regulator circuit 200, when the regulated output voltage (Vout) therefrom is set to be significantly lower than Vcc, or when batteries providing Vcc are charged, the decision circuit 209 does not operate. PFET M5 215 operates in a saturation mode of operation when the condition of equation (4) is met:

$$(Vcc-Vout)>(Vgs-Vt) \tag{4}$$

where Vgs and Vt are the gate-source and threshold voltages of PFET M5 215.

As the Vcc potential drops, the source drain potential of the PFET M5 215 drops to below approximately 150 mV and the PFET M5 215 begins to operate in the triode region of operation. Of course, the source drain potential of 150 mV is only an example and may be different for other applications. When PFET M5 215 starts to operate in the triode region the potential on gate terminal of FET M6 216 coupled to the gate terminal of FET M5 215 results in FET M6 216 to begin conducting current. As the current propagating through FET M6 216 increases, when PFET M5 215 is entering the triode region of operation, a biasing voltage on the gate terminal of FET M7 217 is increased. A current mirror, formed from transistors Q7 227 and Q8 228, provides the biasing voltage to the gate terminal of FET M7 217. Transistor Q6 226 from the decision circuit 209 is used to provide an increase in emitter current for transistors Q1 221 and Q2 222 forming the first controlling amplifier. A control loop is formed between the decision circuit 209, the first controlling amplifier and the PFET regulator circuit 208 and hence the transconductance of the first controlling amplifier is increased in direct proportion to the increase in the collector emitter current of transistor Q6 226 by using the control loop.

Once FET M6 216 is fully conducting, transistors Q1 221 and Q2 222 are provided with increased emitter current in order to modulate the gate potential of PFET M5 215. The third current source 205 is used to bias the gate terminal of FET M7 217. The second current source 204 is used to program the regulated output voltage provided from the output port 200*c* of the current boost PFET regulator circuit 200. A large voltage swing in the gate potential on PFET M5 215 is provided in the triode region of operation and thus transistors Q1 221 and Q2 222 are provided with increased bias current from transistor Q6 226. The control loop, which utilizes the decision circuit 209 and the first controlling amplifier, operates the PFET M5 215 in two modes of operation. In the first mode of operation, the first controlling amplifier operates with reduced transconductance and in the second mode of operation the first controlling amplifier operates with increasing transconductance in order to maintain the frequency response of the overall PFET regulator 200 as PFET M5 215 enters the triode region. Advantageously, by the use of bipolar transistors Q1 221 and Q2 222, disposed in the long tail pair for the first controlling amplifier, the transconductance of the first controlling amplifier is directly proportional to the collector emitter current of transistor Q6 226.

As PFET M5 215 enters the triode region, the transconductance of the first controlling amplifier is increased by the first current source 203. This increase in transconductance (gm) compensates for the gate terminal of the PFET M5 215 no longer functioning as a virtual earth. In the saturation mode of operation, the potential on the gate terminal of the PFET M5 215 varies minimally in response to changing conditions on the output port of the regulator circuit 200. The reason being that a small change in gate potential of the PFET M5 215 results in a large drain voltage change. A majority of the drive current provided from the first controlling amplifier, formed from transistors Q1 221 and Q2 222, is absorbed by the drain-source terminal capacitance of the PFET M5 215. When the PFET M5 215 enters the triode region of operation the drain voltage does not change significantly for large changes in the gate voltage so the gate terminal of PFET M5 215 no longer acts as the virtual earth. Thus, a large amount of charge is provided to the gate terminal of the PFET M5 215 for very small changes in drain voltage, so a reduction in the cut off frequency of the regulator results.

Through selection of component values for FET M6 216, FET M7 217, FET M8 218, transistor Q6 226, transistor Q7 227, transistor Q8 228, resistor R3 233 and resistor R4 234, a substantial compensation for a reduction in the transimpedance of PFET M5 215 as it enters the triode region of operation is achieved.

Figure 3:
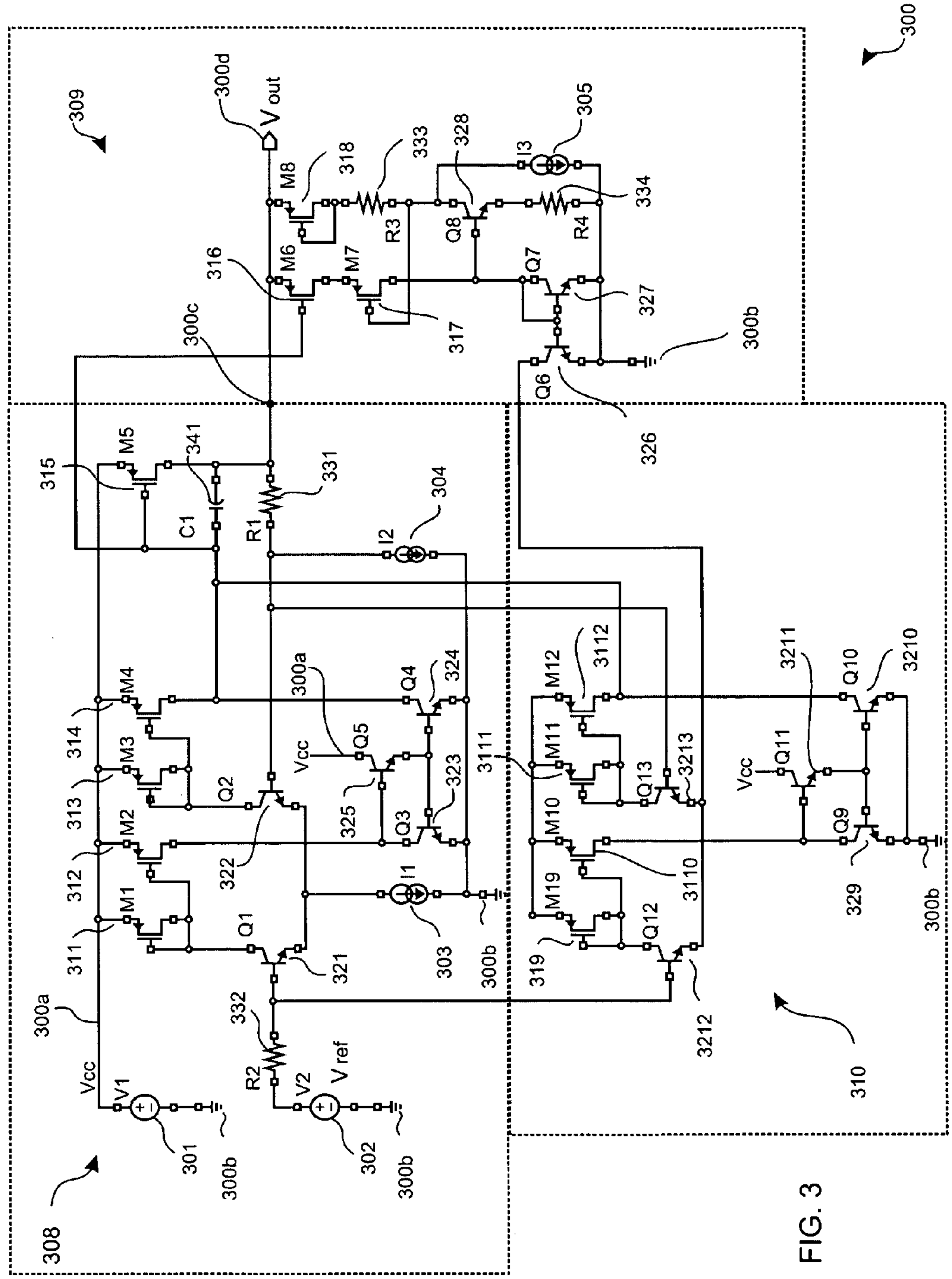

FIG. 3 illustrates a second embodiment of the invention, a dual amplifier LDO regulator circuit 300, which is a variation of the first embodiment of the invention shown in FIG. 2. In the second embodiment 300, a first boost circuit 310 is provided in addition to the PFET regulator circuit 308 and a decision circuit 309. A regulated output voltage is provided from output port 300*c*.

Initially, when the regulated output voltage (Vout) provided from the dual amplifier LDO regulator circuit 300 is set to be significantly lower than Vcc, or when batteries providing Vcc are charged, the first boost circuit 310 and the decision circuit 309 do not operate. The PFET regulator circuit 308 operates in a saturation mode of operation when the condition of equation (5) is met:

$$(Vcc-Vout)>(Vgs-Vt) \tag{5}$$

where Vgs and Vt are the gate-source and threshold voltages of PFET M5 315. As the Vcc potential drops, the source drain potential of the PFET M5 315 drops to below approximately 150 mV and the PFET M5 315 begins to operate in the triode region of operation. Of course, the threshold of 150 mV is a matter of design choice.

The decision circuit 309 and first boost circuit 310 are non operational during normal operation of the dual amplifier LDO regulator circuit 300 but begin to operate when the PFET M5 315 enters the triode region of operation. When PFET M5 315 starts to operate in the triode region, the potential on gate terminal of FET M6 316 coupled to the gate terminal of PFET M5 315 results in FET M6 316 to begin conducting current. As the current propagating through FET M6 316 increases when PFET M5 315 starts to operate in the triode region, a biasing voltage on the gate terminal of M7 317 is increased. A current mirror, formed from transistors Q7 327 and Q8 328, provides the biasing voltage to the gate terminal of FET M7 317. Transistor Q6 326 is used to provide an increase in emitter current for a second controlling amplifier formed from transistors Q12 3212 and Q13 3213 disposed in a differential pair. A control loop is formed between the decision circuit 309, the first controlling amplifier, the second controlling amplifier of the first boost circuit and the PFET regulator circuit 308 and hence the transconductance of the second controlling amplifier is increased in direct proportion to the increase in the collector emitter current of transistor Q6 326 by using the control loop.

Once FET M6 316 is conducting, transistors Q12 3212 and Q13 3213 are provided with an emitter current in order to provide increased transconductance to the gate terminal of PFET M5 315. The first boost circuit 310 is effectively a duplicate of circuit 308. However, this circuit does not commence operation to provide an increased signal to the gate terminal of PFET M5 315 until transistor Q6 326 is conducting. Once transistor Q6 326 is conducting, current is provided to the second controlling amplifier.

The third current source 305 is used to bias the gate terminal of FET M7 317. As more bias current flows through the drain and source terminals of FET M7 317, as a result of FET M6 316 conducting through its drain and source terminals, the second current source 304 is used to reduce this current. A large voltage swing in the gate potential on PFET M5 315 is provided in the triode region and thus transistors Q12 3212 and Q13 3213 are provided with increased bias current from transistor Q6 326. The control loop operates the PFET M5 315 in two modes of operation. In the first mode of operation, the control loop operates with reduced transconductance as the PFET M5 315 operates in a saturation mode of operation. In the second mode of operation the control loop operates with increased transconductance in order to maintain the frequency response of the PFET M5 315 by increasing the transconductance of the second controlling amplifier, formed from transistors Q12 3212 and Q13 3213, as it enters the triode region. Advantageously, by the use of bipolar transistors Q12 3212 and Q13 3213 for the second long tail pair, the transconductance of the second bipolar long tailed pair is directly proportional to the collector emitter current of transistor Q6 226.

The first boost circuit 310 is used to provide a first boost current to the PFET M5 315. The first boost circuit 310 is utilized in conjunction with the decision circuit 309 in order to avoid a large increase of the die area requirements of the regulator circuit 308 in order to provide sufficient first boost current for maintaining the transconductance of the PFET M5 315 when it enters the triode region. If the regulator circuit 308 is increased in size to accommodate the boost current from boost circuit 309 then the increased capacitance associated with the increased size of the regulator circuit 308 results in instability when the regulator circuit 308 is operated without boost when PFET M5 315 is in its saturated region of operation. In summary, the decision circuit decides whether to supply the first boost circuit with current. The amplifier 308 and the boost circuit 310 both decide the degree of imbalance of the overall regulator voltage control loop and feed current to the gate of PFET M5 in order to rebalance the loop. The magnitude of the current driven into the gate of PFET M5 is determined by the degree of imbalance and is further scaled up by the degree of boost provided by the boost circuit 310.

Referring to FIGS. 2 and 3, for a large VCC, the decision circuit 309 or 209, are not active and the boost current delivered to transistors Q1 221 or Q12 3212 and Q2 222 or Q13 3213 with respect to the first embodiment of the invention is negligible. The transconductance (gm) of the first controlling amplifiers for both embodiments of the invention is determined by the first current (I1). When VCC falls below a predetermined threshold, the decision circuit 209 or 309 causes an increase in the current propagating through the first controlling amplifier formed using transistors Q1 221 or Q12 3221 and Q2 222 or Q13 3213. Thus in the first embodiment of the invention, transistors Q1 221, Q2 222, and FETs M1 211 M2 212 M3 213 and M4 214 occupy a large die area in order to propagate this increased current. When this current is not used by the PFET M5 215, the parasitic capacitance is still present and impacts the frequency response of the overall regulator control loop by the addition of parasitic poles which adversely affects stability. In contrast, with reference to the second embodiment, the active devices in circuit 308 are identical in size to that of the prior art circuit 100 and the parasitic capacitance loading is minimal. Circuits 309 and 310 operate in conjunction to provide first and first boost currents to PFET M5 315 only when VCC falls below a predetermined threshold. When the first boost circuit 310 and the decision circuit 309 are non operational, the parasitic capacitance impact that circuit 310 has on circuit 308 is minimal compared to the forced size increased of active components used in circuit 208. The first boost circuit 310 is designed such that it optionally provides up to 30 times more current than is provided from the first controlling amplifier to the PFET M5 315.

Thus, the capacitance of the first boost circuit 310, which is a much larger device than 308, does not affect the frequency response of the dual amplifier LDO regulator circuit 300 when operated with PFET M5 315 in its saturated mode of operation. Additional capacitance during normal operation of the dual amplifier LDO regulator circuit 300 arises from the drain terminal of the FET M12 3112 and from the collector terminal of transistor Q10 3210 connected to gate terminal of PFET M5 315. Although both the FET M12 3112 and transistor Q10 3210 are large area components and occupy a large die area, their combined capacitance is still substantially smaller than the capacitance associated with the gate terminal of PFET M5 315 so there is no significant impact on the frequency response of the dual amplifier LDO regulator circuit 300.

The second embodiment of the invention 300 preferably imposes less parasitic capacitance because the first boost current is provided from a duplicate circuit that is normally disabled. Referring to the first embodiment, the active devices in circuit 208 are sized in such a manner in order to propagate the first boost current emitted from circuit 209 when the PFET M5 215 enters the triode region of operation.

In order to provide a fast ramping low drop out regulator suitable for use in a GSM power amplifier (PA), control of the PA output power in direct proportion to the square of the regulated output voltage is preferable. By using the GSM PA in a saturation mode of operation, accurate control of the PA output is achieved by controlling the supply voltage provided to the PA. If the programming response of the regulator is fast it is possible to control the attack/decay profile of the PA output power, which maintains PA output signal spuriae inside specification. This minimizes the difficulty in calibrating the PA and transceiver combination and thereby saves manufacturing cost of a GSM device, such as a cell phone. The embodiments of the invention illustrate the advantages of utilize the PFET in a triode region of operation as a fast regulator circuit. This minimizes the die area of the PFET, which makes it suitable for integration into the GSM PA using a SiGe BiCMOS process.

Numerous other embodiments may be envisaged without departing from the spirit or scope of the invention.

What is claimed is:

1. A low drop out (LDO) regulator circuit for providing a regulated output voltage from a supply voltage source comprising:

a regulator circuit comprising an output port and a first regulating FET having gate, drain and source terminals, the output port coupled to the drain terminal for providing the regulated output voltage therefrom, the first regulating FET for operating in first mode of operation when a potential of the supply voltage source is above a predetermined potential; and, a decision circuit for deciding whether to increase a transconductance to the first regulating FET when a potential of the supply voltage is one of at the predetermined potential and below the predetermined potential such that the first regulating FET operates in a second mode of operation.

2. A low drop out (LDO) regulator circuit according to claim 1, wherein the first mode of operation is a saturation mode of operation.

3. A low drop out (LDO) regulator circuit according to claim 2, wherein the second mode of operation is a triode region mode of operation.

4. A low drop out (LDO) regulator circuit according to claim 1, wherein the predetermined potential difference is approximately 150 mV above a potential of the regulated output voltage.

5. A low drop out (LDO) regulator circuit according to claim 1, comprising a second current source coupled in series with the first FET, the second current source for adjusting a potential of the regulated output voltage.

6. A low drop out (LDO) regulator circuit according to claim 1, comprising a first controlling amplifier, wherein for the triode mode of operation the reduction of the transimpedance of the PFET as it enters triode region is compensated by an increase in transconductance of the first controlling amplifier.

7. A low drop out (LDO) regulator circuit according to claim 6, wherein the first controlling amplifier comprises a first bipolar transistor and a second bipolar transistor disposed in a long tail pair.

8. A low drop out (LDO) regulator circuit according to claim 7, comprising a reference voltage source for providing a reference voltage to the first controlling amplifier.

9. A low drop out (LDO) regulator circuit according to claim 1, comprising a first boost circuit coupled with the decision circuit and the first FET, the first boost circuit for providing a first boost current to the decision circuit for further provision to the first FET in dependence upon the decision to one of increase and decrease the transconductance of the first FET.

10. A low drop out (LDO) regulator circuit according to claim 9, comprising a second controlling amplifier, wherein for the triode mode of operation the reduction of the transimpedance of the PFET as it enters triode region is compensated by an increase in transconductance of the second controlling amplifier.

11. A low drop out (LDO) regulator circuit according to claim 5, comprising:

- a first controlling amplifier comprising a first long tail pair of transistors comprising first and second bipolar transistors having emitter, collector and base terminals;
- a first resistor comprising first and second terminals, the first terminal thereof coupled to the base terminal of the second transistor and the second terminal thereof coupled to the second current source, the output port and the drain terminal of the first FET; and,
- a first current source connected to the emitter terminals for sourcing a first current that is proportional to absolute temperature, where the voltage reference is for providing a reference voltage to the base terminal of the first transistor of the first long tail pair of transistors.

12. A low drop out (LDO) regulator circuit according to claim 1, wherein the first regulating FET is a PFET.

13. A low drop out (LDO) regulator circuit according to claim 1, wherein, in use, a gain of the first regulating FET is approximately the same when the first regulating FET is operating in the first mode of operation as is the gain when the first regulating FET is operating in the second mode of operation.

14. A method of providing a regulated output voltage from a supply voltage source comprising:

- providing a field effect transistor (FET) regulator circuit comprising a regulating FET;
- providing a decision circuit coupled to the regulating FET;
- operating the regulating FET in a saturation mode of operation; and,
- upon operation of the regulating FET in a triode region providing increased signal gain to the regulating FET comprising:
- enabling operation of the decision circuit upon operation of the regulating FET in the triode region; and,
- providing a first boost current to the regulating FET results in an increase in a signal provided to the gate terminal thereof.

15. A method according to claim 14, comprising providing a first boost circuit for providing of the first boost current to the regulating FET.

16. A method according to claim 14, comprising:

- providing a first controlling amplifier coupled with the regulating FET and the decision circuit; and,
- operating of the first controlling amplifier in conjunction with the decision circuit and the FET regulator circuit in a control loop.

17. A method according to claim 16, wherein, in use, in the triode region of operation the control loop operates with increased bandwidth in order to maintain the frequency response of the regulating FET.

18. A method according to claim 17, wherein regulating FET is a PFET.

19. A method of providing a regulated output voltage from a supply voltage source comprising:

- providing a field effect transistor (FET) regulator circuit comprising a regulating FET;
- providing a decision circuit coupled to the FET regulator circuit;
- providing a first boost circuit coupled with the FET regulator circuit;
- operating the regulating FET in a saturation mode of operation;
- upon operation of the regulating FET in the triode region, enabling operation of the first boost circuit for providing a first boost current;
- enabling operation of the decision circuit; and,
- deciding using the decision circuit whether to provide the first boost current to the FET regulator circuit for resulting in an increase in a signal that is provided to the gate terminal of the regulating FET.

20. A method according to claim 19, comprising: providing an increase in transconductance to the gate terminal of the regulating FET as a result of enabling the operation of the first boost circuit and in dependence upon the decision of the decision circuit as whether the first boost current is provided to the regulating FET.

21. A method according to claim 20, comprising:

- providing a first controlling amplifier coupled with the regulating FET and the decision circuit; and,
- operating of the first controlling amplifier in conjunction with the decision circuit and the FET regulator circuit in a control loop.

22. A method according to claim 21, wherein in the triode region of operation the control loop operates with increased bandwidth in order to maintain the frequency response of the regulating FET.

23. A method according to claim 19, wherein regulating FET is a PFET.

24. A method according to claim 19, wherein prior to operating of the regulating FET in the triode region of operation, a parasitic capacitance arising from the first boost circuit and the decision circuit has a minimal effect on operation of the FET regulator circuit.

25. A method according to claim 19, wherein in the triode region of operation the PFET has reduced bandwidth and where the increased current provided to the PFET regulator circuit increases the bandwidth of the PFET regulator circuit.

26. A low drop out (LDO) regulator circuit for providing a regulated output voltage from a supply voltage source comprising:

- an output port;
- a regulator circuit comprising a first FET having gate, drain and source terminals, the output port coupled to the drain terminal for providing the regulated output voltage therefrom, the first FET for operating in first mode of operation when a potential of the supply voltage source is above a predetermined potential;

a voltage reference for providing a reference potential;

a first long tail pair of transistors comprising first and second transistors having emitter, collector and base terminals;

a second current source coupled to the base terminal of the second transistor from the first long tail pair of transistors;

a first resistor disposed between the base terminal of the second transistor of the first long tail pair and the second current source and the drain terminal of the first FET and the output port, the second current source for sinking a second current in order to increase the potential of the regulated output voltage;

a first current source connected to the emitter terminals for emitting a first current that is proportional to absolute temperature thereto, where the voltage reference is for providing a reference voltage to the base terminal of the first transistor of the first long tail pair of transistors; and, a decision circuit comprising a second FET having a gate terminal coupled to the gate terminal of the first FET for reducing a transimpedance of the first FET by controlling a provision of a first boost current for provision to the long tail pair when the potential of the supply voltage source is below the predetermined potential such that the first FET operates in a second mode of operation thereof and is for other than providing the first boost current when the potential of the supply voltage source is above the predetermined potential.

27. A low drop out (LDO) regulator circuit according to claim 26, comprising a first boost circuit for providing of the first boost current and coupled with the decision circuit and the first FET, the decision circuit for providing the first boost current to the first FET when the first FET operates in the first mode of operation and for other than providing the first boost current to the first FET when the first FET operates in the second mode of operation.

28. A low drop out (LDO) regulator circuit according to claim 26, wherein the first FET is a PFET.

* * * * *